United States Patent [19]

Golland et al.

[11] Patent Number: 5,668,045
[45] Date of Patent: Sep. 16, 1997

[54] PROCESS FOR STRIPPING OUTER EDGE OF BESOI WAFERS

[75] Inventors: David I. Golland, Chesterfield; Robert A. Craven, Olivette; Ronald D. Bartram, Webster Groves, all of Mo.

[73] Assignee: SiBond, L.L.C., St. Peters, Mo.

[21] Appl. No.: 346,695

[22] Filed: Nov. 30, 1994

[51] Int. Cl.⁶ .................... H01L 21/20; H01L 21/461
[52] U.S. Cl. .................... 438/459; 148/DIG. 12; 148/DIG. 135; 148/DIG. 161; 438/977
[58] Field of Search .................... 437/86, 249, 947, 437/974, 62; 148/DIG. 12, DIG. 135, DIG. 161; 156/629.1, 630.1, 631.1, 632.1, 633.1, 153

[56] References Cited

U.S. PATENT DOCUMENTS

| | | | |
|---|---|---|---|
| 4,649,627 | 3/1987 | Abernathey et al. | 29/571 |
| 4,735,679 | 4/1988 | Lasky | 156/636 |
| 4,888,304 | 12/1989 | Nakagawa et al. | 437/974 |
| 5,032,544 | 7/1991 | Ito et al. | 437/228 |
| 5,100,809 | 3/1992 | Nakashima et al. | 437/974 |
| 5,152,857 | 10/1992 | Ito et al. | 156/153 |
| 5,258,323 | 11/1993 | Sarma et al. | 437/63 |
| 5,295,331 | 3/1994 | Honda et al. | 51/283 E |
| 5,298,452 | 3/1994 | Meyerson | 437/81 |
| 5,308,776 | 5/1994 | Gotou | 437/21 G |
| 5,340,435 | 8/1994 | Ito et al. | 156/632 |
| 5,344,524 | 9/1994 | Sharma et al. | 437/62 |
| 5,455,193 | 10/1995 | Egloff | 437/63 |
| 5,455,202 | 10/1995 | Malloy et al. | 437/974 |
| 5,494,849 | 2/1996 | Iyer et al. | 437/63 |

*Primary Examiner*—John Niebling
*Assistant Examiner*—Brian K. Dutton
*Attorney, Agent, or Firm*—Senniger, Powers, Leavitt & Roedel

[57] ABSTRACT

A process for stripping the outer edge of a bonded BESOI wafer. The bonded BESOI wafer comprises a handle wafer, an oxide layer on one surface of the handle wafer, a device layer bonded to the oxide layer, and a p⁺ etch-stop layer on the device layer having an exposed face. The process comprises masking the exposed face of the p⁺ etch-stop layer, and abrading the periphery of the BESOI wafer to remove edge margins of the p⁺ etch-stop layer and device layer.

17 Claims, 4 Drawing Sheets

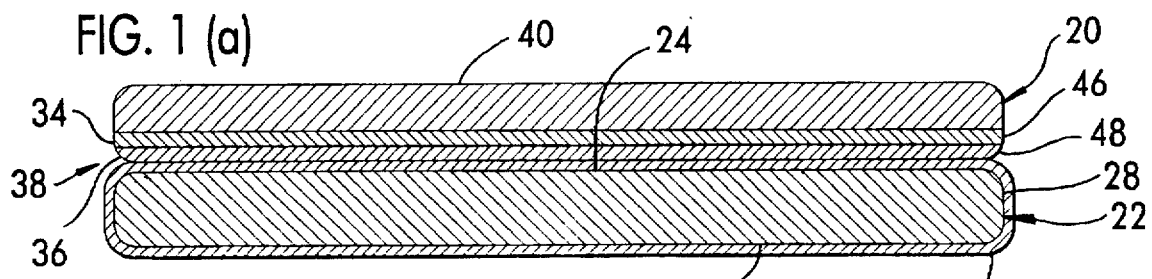
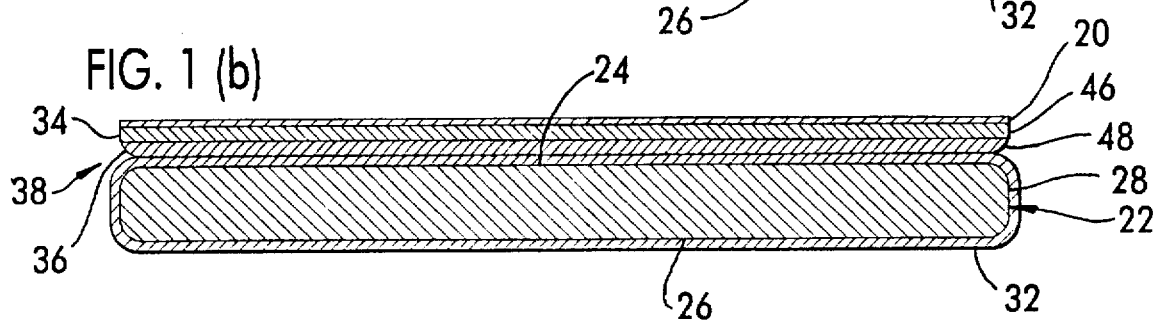
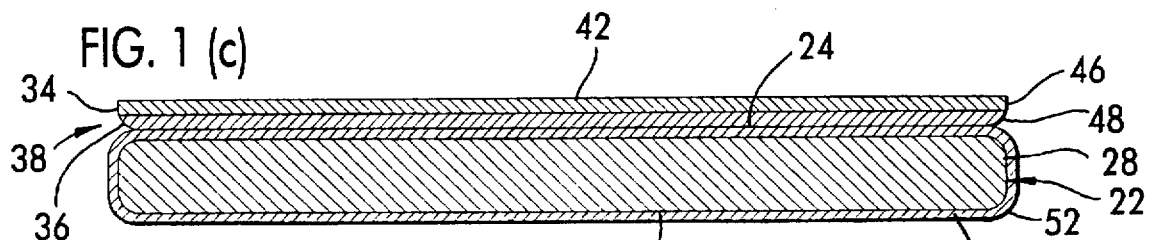
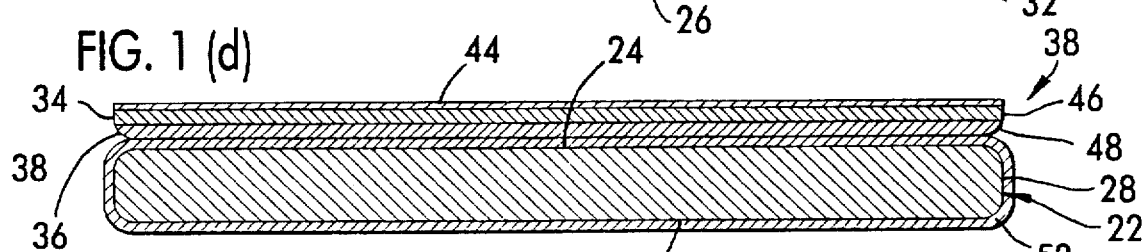
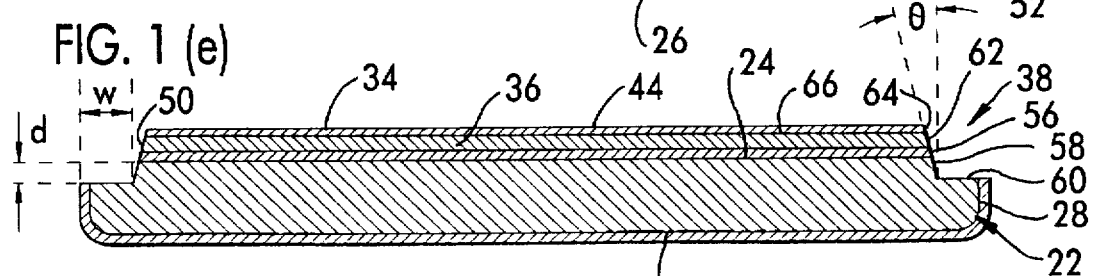
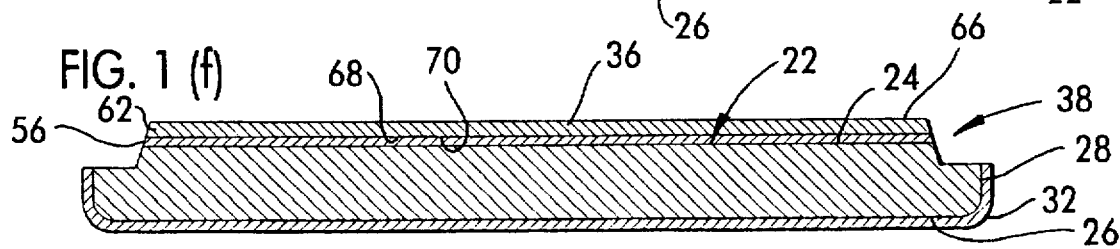

5,668,045

PROCESS FOR STRIPPING OUTER EDGE OF BESOI WAFERS

BACKGROUND OF THE INVENTION

This invention generally relates to silicon-on-insulator ("SOI") bonded semiconductor wafers and, more particularly to a process for stripping the outer edges of bond and etch back silicon-on-insulator ("BESOI") wafers.

An SOI bonded wafer has a handle wafer, a thin device layer, and an oxide film (layer), constituting an insulating film, between the handle wafer and device layer. It is made from two semiconductor silicon wafers each having at least one face with specular gloss. An oxide layer is formed on the specular glossy face of one or both wafers, and the two wafers are joined together with the specular glossy faces facing each other and with the oxide layer being between the two wafers. The joined wafers are heated to an appropriate temperature to increase the bonding strength. One of the wafers constitutes a handle wafer and the other constitutes a device wafer. The exposed surface of the device wafer is ground and/or etched and polished until the device wafer becomes a thin layer, i.e., the device layer.

A BESOI wafer is one type of SOI wafer and may be prepared by forming an etch stop layer of very heavily doped silicon on a silicon substrate, forming a device layer of silicon on the etch stop layer, forming an insulator layer on the device layer and bonding a handle wafer to the insulator layer. The silicon substrate may be removed by etching, or by a combination of mechanical grinding followed by etching with a preferential etch solution such as KOH which will stop etching at the interface of the etch stop layer and the exposed etch stop layer may thereafter be removed using a preferential etch solution such as a mixture of HF/nitric acid/acetic acid ("HNA") in a ratio of 1:3:8. The HNA preferentially etches the etch stop layer, thus exposing the underlying device layer. See, for example, European Patent Application, Publication No. 0 520 216 A2.

When BESOI wafers are bonded, however, the edges of the wafers often fail to uniformly bond. As a result, the device layer of BESOI wafers often have edge margins of approximately 2–10 mm which exhibit voids, bubbles and other delaminations. These voids, bubbles and other delaminations detract from the desirability of the BESOI wafers.

SUMMARY OF THE INVENTION

Among the several objects of this invention may be noted the provision of improved BESOI wafer and process for stripping edge thereof; the provision of such a process which eliminates delaminations without damaging the device layer; the provision of such a process which is inexpensive; and the provision of such BESOI wafers free of edge margin delaminations.

In general, a process of the present invention is for stripping the outer edge of a BESOI wafer. The BESOI wafer comprises a handle wafer, an oxide layer on one surface of the handle wafer, a device layer bonded to the oxide layer, and a $p^+$ etch-stop layer on the device layer having an exposed face. The process comprises masking the exposed face of the $p^+$ etch-stop layer, removing the edge margins of the $p^+$ etch-stop layer and device layer from periphery of the BESOI wafer, and removing the $p^+$ etch-stop layer to expose the device layer.

In accordance with another aspect of the present invention, a BESOI wafer is provided. The BESOI wafer comprises a handle wafer, an oxide layer on at least one surface of the handle wafer, and a device layer. The device layer has an exposed surface, a bonded surface generally parallel to and opposite the exposed surface, and a mean thickness of between approximately 500 angstroms and approximately 50 microns with a thickness variance of less than approximately 10% of the mean thickness. The bonded surface is bonded generally in its entirety to the oxide layer. The device layer is radially contained within the periphery of the bonded surface.

Other objects and features will be in part apparent and in part pointed out hereinafter.

BRIEF DESCRIPTION OF THE DRAWINGS

FIGS. 1(a)–1(f) are schematic cross-sectional views of an SOI bonded wafer at various stages in a process of the present invention for thinning and edge stripping the BESOI wafer;

Corresponding reference characters indicate corresponding parts throughout the several views of the drawings.

DESCRIPTION OF THE PREFERRED EMBODIMENTS

Figure 2:
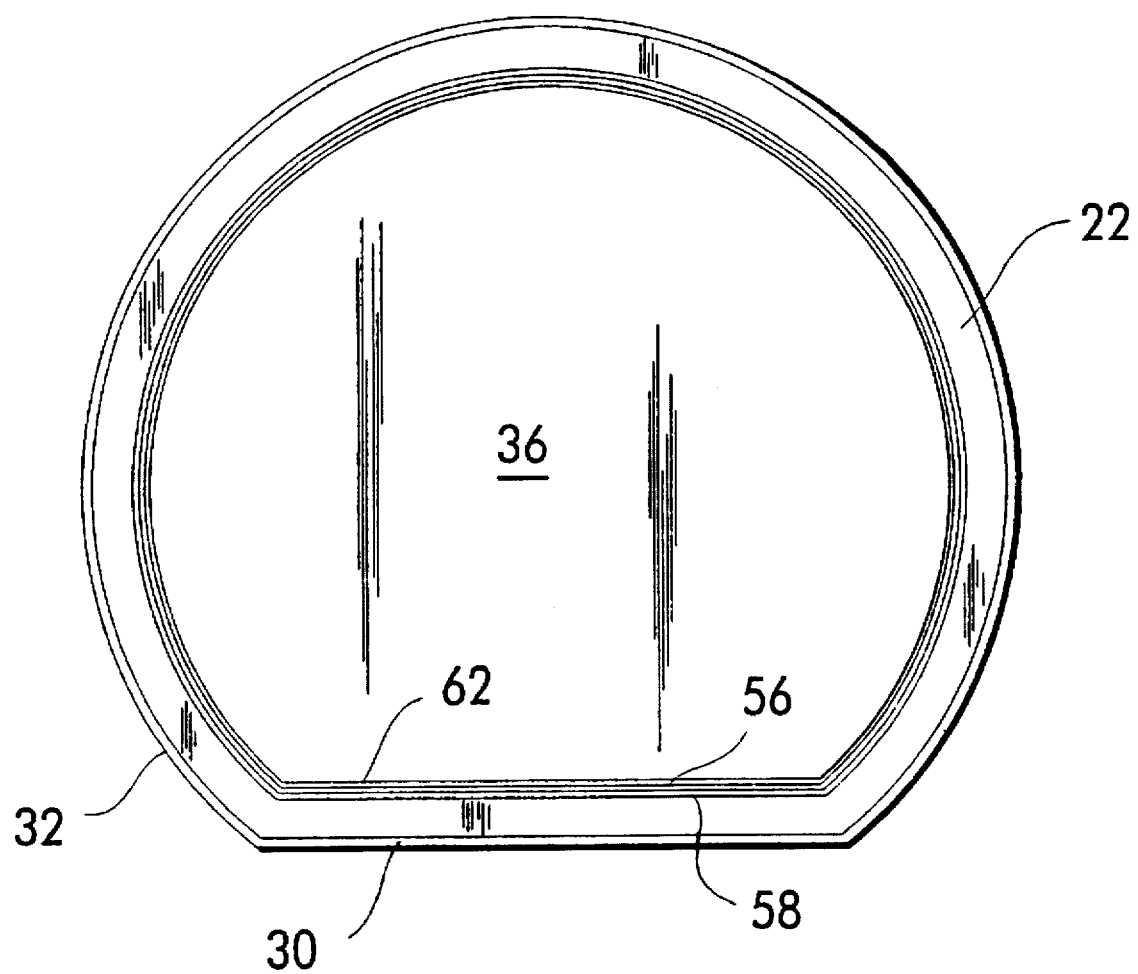
FIG. 2 is a top plan view of the BESOI bonded wafer shown in FIG. 1(f)

Referring now to the drawings, and first more particularly to FIGS. 1(a)–1(f), a silicon device wafer, indicated generally at 20, is bonded to a silicon handle wafer, indicated generally at 22. The handle wafer 22 has first and second flat faces (upper and lower faces 24 and 26, respectively, as viewed in FIG. 1(a)) and a generally circular periphery 28. A portion of the periphery has an orientation flat 30 (FIG. 2) for allowing a user to identify wafer orientation. As shown in FIG. 1(a), an oxide film (or layer) 32 is grown on and surrounds the handle wafer 22. A $p^+$ etch stop layer 34 is formed on the device wafer 20, and a device layer 36 is formed on the $p^+$ etch stop layer. Preferably, both wafers 20, 22 have initial diameters of approximately 200 mm, the device wafer 20 has an initial thickness of approximately 725 microns, the oxide layer 32 has a thickness of approximately 1,000–10,000 angstroms, the $p^+$ etch stop layer 34 has an initial thickness of approximately 1,000–10,000 angstroms, and the device layer 36 has an initial thickness of approximately 500 angstroms to 50 microns. The device wafer 20 is positioned on the handle wafer 22 so that the device layer 36 overlies the upper face 24 of the handle wafer and contacts the oxide layer 32. The device layer 36 is bonded to the oxide layer 32 and the bond strength is increased by high temperature annealing to form a BESOI bonded wafer (FIG. 1(a)), generally indicated at 38. As shown in FIG. 1(a), with the device layer 36 bonded to the oxide layer 32, the $p^+$ etch stop layer 34 is on the device layer, the device wafer 20 is on the $p^+$ etch stop layer, and an upper face 40 of the device wafer is exposed.

The $p^+$ etch stop layer 34 comprises an abrupt, well-defined layer which is epitaxially grown by techniques known in the art, such as, gas source molecular beam epitaxy ("MBE"), ultra high vacuum chemical vapor deposition ("UHCVD"), or atmospheric pressure chemical vapor deposition ("APCVD"). The etch stop layer preferably comprises boron as a dopant and the layer may contain boron in the range of $1 \times 10^{19}$ atoms/cm$^3$ to $5 \times 10^{20}$ atoms/cm$^3$. Optionally, the etch stop layer may be strain compensated by 0.5% to 2.5% germanium. Etch stop layers having such compositions and their preparation are described more fully, for example, in U.S. Pat. No. 5,310,451 and European Patent Application, Publication No. 0 520 216 A2.

Device layer 36 is preferably about 500 angstroms to 1 micrometer thick and epitaxially formed on the p$^+$ etch stop layer by epitaxial techniques similar to those used to grow the p$^+$ etch stop layer. The device layer 36, however, must be of a conductivity type and resistivity type (e.g., n or p-) to allow the use of preferential etchants as described herein.

Referring to FIG. 1(b), the upper face 40 of the device wafer 20 is ground and polished with a conventional grinder (not shown) and a conventional polisher (not shown) to thin the device wafer to approximately 5–10 microns. The device wafer 20 is then subjected to a suitable etchant solution, such as KOH, which completely etches it away to expose an upper surface 42 (FIG. 1(c)) of the p$^+$ etch stop layer 34. The upper surface 42 of the p$^+$ etch stop layer 34 is then masked with a suitable masking 44 (FIG. 1(d)), such as photo resist, resin or wax. After masking, the edge margins 46, 48 of the p$^+$ etch stop layer 34 and device layer 36 are removed from the periphery of the BESOI wafer 38. Preferably, the periphery of the BESOI wafer 38 is abraded to remove the edge margins 46, 48 and the width w (FIG. 1(e)) of edge margins removed is approximately 2–10 mm to ensure removal of all delaminations. Also, the periphery of the BESOI wafer 38 is preferably abraded at an angle Θ (preferably 0°–30°) to form a beveled edge 50 which would minimize the trapping of particles in the corner of that edge. The periphery of the BESOI wafer 38 may be abraded by grinding or by a chemical/mechanical polishing process. The masking 44 prevents debris, generated during the abrading process, from pitting or otherwise damaging the p$^+$ etch stop layer 34 and device layer 36. Thus, the masking 44 protects the p$^+$ etch stop layer 34 and device layer 36.

To abrade by grinding, the handle wafer 22 is held on a rotating vacuum chuck (not shown) and a rotating grinding wheel (not shown) is brought into contact with the periphery of the BESOI wafer 38. To abrade the orientation flat 30, the vacuum chuck is held stationary and the rotating grinding wheel is linearly moved across the orientation flat. Preferably, the grinding wheel is of a fine mesh, industrial diamond abrasive (5–10 micron particles) embedded in a resin bonded matrix. To abrade by polishing, a rotating polyurethane polishing pad (not shown) rubs a slurry solution of a free abrasive (e.g., a colloidal silica suspended in an alkali solution) against the rotating periphery of the BESOI wafer 38. If the periphery of the BESOI wafer 38 is abraded by grinding, an edge margin 52 (FIG. 1(d)) of the oxide layer 32 and a generally annular region 54 of the handle wafer 22 adjacent the edge margin of the oxide layer are preferably removed during grinding to ensure complete removal of the edge margin 48 of the device layer 36. Removal of the edge margin 52 of the oxide layer 32 forms an abraded edge 56 (FIG. 1(e)) of the oxide layer 32. Removal of the annular region 54 of the handle wafer 22 forms an abraded edge 58 and a generally annular recess 60 on the handle wafer. The abraded edge 58 of the handle wafer 22 is coincident with the abraded edge 56 of the oxide layer 32 and coincident with abraded edges 62, 64 of the device layer 36 and etch stop layer 34. The depth d (FIG. 1(e)) of the annular recess of the handle wafer 22 is less than the thickness of the handle wafer and is preferably approximately 5 microns. If abraded by polishing, complete removal of the edge margin 48 of the device layer 36 may be achieved without abrading through the oxide layer 32 or handle wafer 22.

Figure 3:
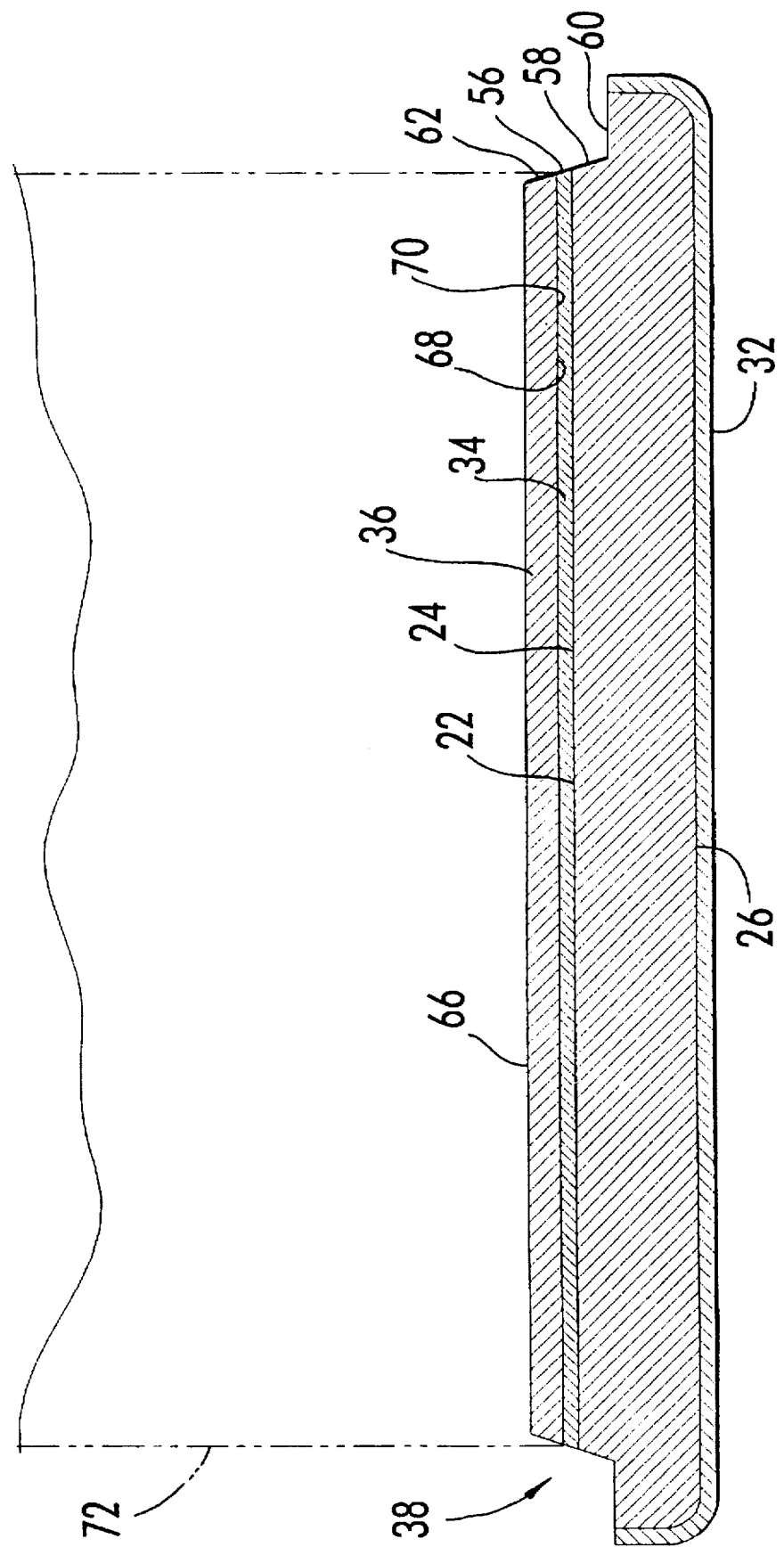
FIG. 3 is an enlarged schematic cross-sectional view of the BESOI bonded wafer shown in FIG. 1(f)

After the periphery of the BESOI wafer 38 is abraded, the masking 44 is stripped from the top surface of the BESOI wafer. The p$^+$ etch stop layer 34 is then exposed to a suitable etchant which preferentially etches the etch stop layer without etching the device layer 36. Such etchants are well known in the art and include, for example, mixtures of HF/nitric acid/acetic acid. The etchant completely removes the etch stop layer 34 to expose a top surface 66 of the device layer 36 which is generally parallel to and opposite a bottom surface 68 bonded to the oxide layer 32. As used herein, the portion of the bottom surface 68 of the device layer 36 bonded to the oxide layer 32 is referred to as a bonded surface 70. The device layer 36 has a mean thickness of between approximately 500 angstroms and approximately 50 microns with a thickness variance of less than approximately 10%. Thus, if the device layer 36 has a mean thickness of approximately 1000 angstroms, its thinnest region will be no less than approximately 900 angstroms and its thickest region will be no less than approximately 1100 angstroms. Preferably, the mean thickness of the device layer 36 is less than approximately 2 microns and, more preferably, less than approximately 5000 angstroms. The bottom surface 68 is bonded in its entirety to the oxide layer 32 and, therefore, the bottom surface is the same as the bonded surface 70 and is virtually free of delaminations. With the bottom surface 68 bonded in its entirety to the oxide layer 32, the entire device layer 36 is radially contained within a generally cylindric surface 72 (FIG. 3) perpendicular to the bonded surface 70 and intersecting the periphery of the bonded surface all around the device layer. Because of the complete bonding of the bottom surface 68 of the device layer, no portions of the device layer 36 will flake off and contaminate the wafer during fabrication of semiconductor devices on the BESOI wafer 38.

Referring now to FIGS. 4(a)–4(e), a process similar to the process described above is exemplified with another type of device wafer, indicated generally at 120. The device wafer 120 is bonded to a silicon handle wafer, indicated generally at 122. The handle wafer 122 is identical to the handle wafer 22. An oxide film 132 is grown on and surrounds the handle wafer 122. A device layer 136 is formed directly on the device wafer 120. The device layer 136 is bonded to the oxide layer 132 and the bond strength is increased by high temperature annealing to form a BESOI bonded wafer (FIG. 4(a)), generally indicated at 138. BESOI bonded wafer 138 is a heavily doped, p$^+$ wafer, having at least about $1 \times 10^{18}$ boron atoms/cm$^3$.

Figure 4:
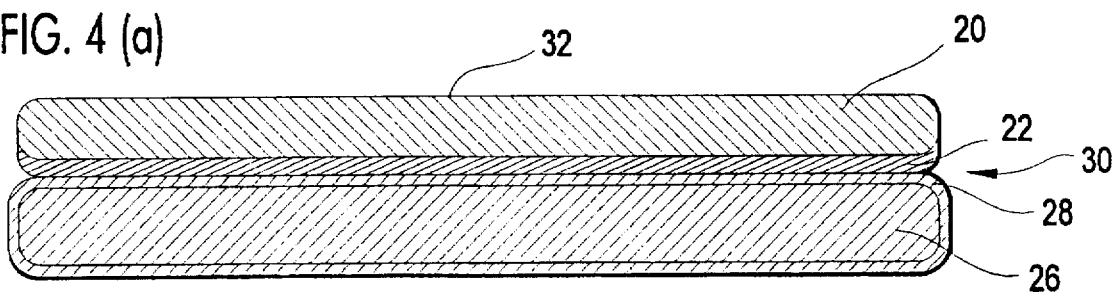
FIGS. 4(a)–4(e) are schematic cross-sectional views of another type BESOI bonded wafer at various stages in a process of the present invention for thinning and edge stripping the BESOI wafer.
Figure 4:
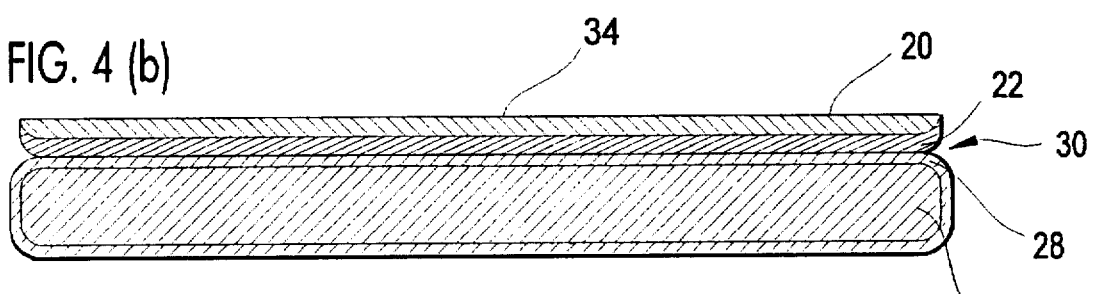
Figure 4:
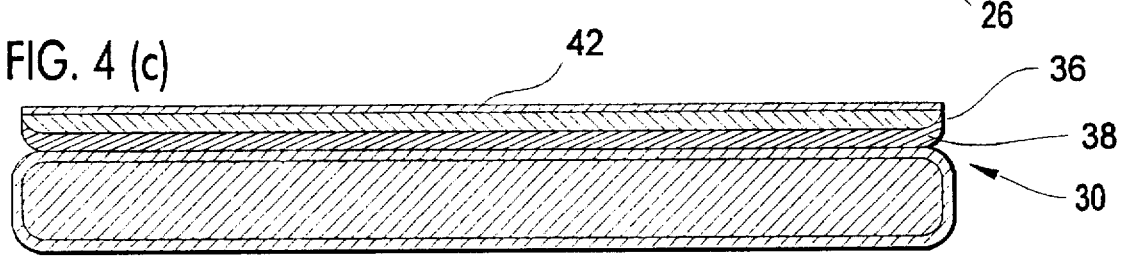
Figure 4:
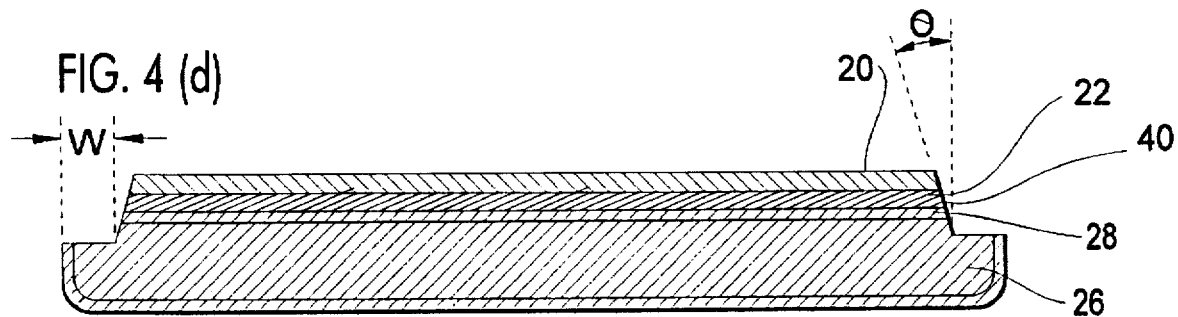
Figure 4:
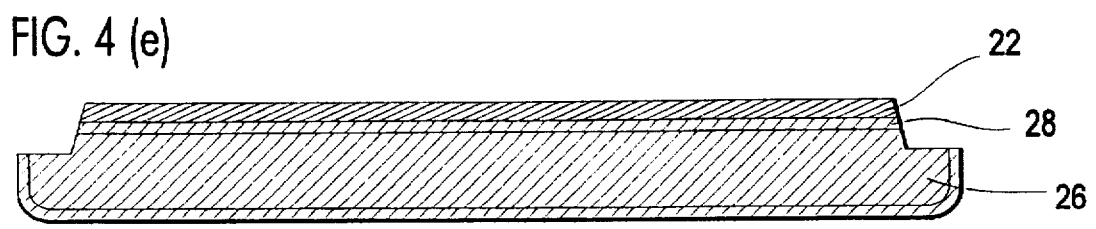

The wafer thinning and edge stripping processes for BESOI wafer 138 are similar to those for wafer 38. Referring to FIG. 4(b), an upper face 140 of the device wafer 120 is ground and polished to thin the device wafer to approximately 5–10 microns. The upper face 140 of the device wafer is then masked with a suitable masking 144 (FIG. 4(c)). After masking, the periphery of the BESOI wafer 138 is abraded in a manner similar to that described with reference to the BESOI wafer 38 and with similar results. After the periphery of the BESOI wafer 138 is abraded, the masking 144 is stripped from the upper face 140 of the device wafer 120. The device wafer 120 is then subjected to a suitable etchant which preferentially etches the device wafer without etching the device layer 136. The etchant completely removes the device wafer 120 to expose a top surface 166 of the device layer 136. The exposed top surface 166 is then preferably polished via a suitable chemical/mechanical polishing process.

The finished BESOI wafer 138 shown in FIG. 4(e) is substantially similar to the finished BESOI wafer 38 shown in FIG. 1(f), except the thickness of the device layer 136 may be thicker than the device layer 36. If a BESOI wafer with a device layer thickness of less than approximately 2 microns is desired, then the process of FIGS. 1(a)–1(f) is preferred; if a BESOI wafer with a device layer thickness of more than approximately 2 microns but less than approximately 50 microns, then the process of FIGS. 4(a)–4(e) is preferred.

In view of the above, it will be seen that the several objects of the invention are achieved and other advantageous results attained.

As various changes could be made in the above constructions and processes without departing from the scope of the invention, it is intended that all matter contained in the above description or shown in the accompanying drawings shall be interpreted as illustrative and not in a limiting sense.

What is claimed is:

1. A process for stripping the outer edge of a bonded BESOI wafer comprising a handle wafer having a face, an oxide layer on the face of the handle wafer, a device layer bonded to the oxide layer, the device layer having an edge margin, and a $p^+$ layer on the device layer, the $p^+$ layer having an edge margin and an exposed face, the process comprising masking the exposed face of the $p^+$ layer;

removing the edge margins of the $p^+$ layer and the device layer, and removing the $p^+$ layer to expose the device layer.

2. The process as set forth in claim 1 wherein the edge margins of the $p^+$ layer and the device layer are removed by abrading.

3. The process as set forth in claim 2 further comprising removing an edge margin of the oxide layer and an annular region of the handle wafer adjacent the edge margin of the oxide layer, the annular region of the handle wafer having a thickness less than the thickness of the handle wafer, the edge margin of the oxide layer and the annular region of the handle wafer being removed by abrading.

4. The process as set forth in claim 3 wherein the edge margins of the $p^+$ layer, the device layer and the oxide layer and the annular region of the handle wafer are removed by grinding.

5. The process as set forth in claim 3 wherein the edge margins of the oxide layer, the device layer and the $p^+$ layer each have a width of at least approximately 2 mm.

6. The process as set forth in claim 3 wherein the edge margins of the oxide layer, the device layer and the $p^+$ layer each have a width of between approximately 2 mm and approximately 10 mm.

7. The process as set forth in claim 3 wherein removal of the edge margin of the oxide layer defines an abraded edge of the oxide layer, and removal of the annular region of the handle wafer defines an abraded edge of the handle wafer, the abraded edge of the handle wafer being coincident with the abraded edge of the oxide layer.

8. The process as set forth in claim 2 wherein the edge margins of the $p^+$ layer and the device layer are removed by a chemical-mechanical polishing process.

9. The process as set forth in claim 1 wherein the oxide layer has an edge margin which is not removed.

10. A process for stripping the outer edge of a bonded BESOI wafer comprising a handle wafer having a face, an oxide layer on the face of the handle wafer, a device layer bonded to the oxide layer, the device layer having an edge margin, and a $p^+$ layer on the device layer, the $p^+$ layer containing about $1 \times 10^{19}$ atoms/cm$^3$ to about $5 \times 10^{20}$ atoms/cm$^3$ of boron and having an edge margin and an exposed face, the process comprising forming a mask on the exposed face of the $p^+$ layer;

removing the edge margins of the $p^+$ layer and the device layer;

stripping the mask from the exposed face of the $p^+$ layer after the edge-margins of the $p^+$ layer and the device layer have been removed; and removing the $p^+$ layer after the mask has been stripped by exposing the $p^+$ layer to an etchant.

11. The process as set forth in claim 10 wherein the edge margins of the $p^+$ layer and the device layer are removed by abrading.

12. The process as set forth in claim 10 wherein the oxide layer has an edge margin which is not removed.

13. The process as set forth in claim 10 further comprising polishing the device layer after the $p^+$ layer is removed.

14. The process as set forth in claim 10 wherein the edge margins of the $p^+$ layer and the device layer each have a width of at least about 2 mm.

15. The process as set forth in claim 10 further comprising removing an edge margin of the oxide layer and an annular region of the handle wafer adjacent the edge margin of the oxide layer, the edge margin of the oxide layer and the annular region of the handle wafer being removed by abrading, wherein removal of the edge margin of the oxide layer defines an abraded edge of the oxide layer, and removal of the generally annular region of the handle wafer defines an abraded edge of the handle wafer, the abraded edge of the handle wafer being coincident with the abraded edge of the oxide layer.

16. A process for stripping the outer edge of a bonded BESOI wafer comprising a handle wafer having a face, an oxide layer on the face of the handle wafer, a device layer bonded to the oxide layer, the device layer having an edge margin, and a layer on the device layer which is preferentially etchable relative to the device layer, the preferentially-etchable layer having an edge margin and an exposed face, the process comprising masking the exposed face of the preferentially-etchable layer, removing a peripheral portion of the preferentially-etchable layer and the device layer, the removed portion consisting of the edge margin of the preferentially-etchable layer and the edge margin of the device layer, and after the peripheral portion of the preferentially-etchable layer and the device layer are removed, removing the remaining portion of the preferentially-etchable layer to expose the remaining portion of the device layer.

17. The process as set forth in claim 16, wherein the width of the edge margins being removed ranges from about 2 mm to about 10 mm.

* * * * *